(12) United States Patent
Ottens et al.

(10) Patent No.: US 7,307,696 B2
(45) Date of Patent: Dec. 11, 2007

(54) LITHOGRAPHIC APPARATUS AND DEVICE MANUFACTURING METHOD

(75) Inventors: Joost Jeroen Ottens, Veldhoven (NL); Sjoerd Nicolaas Lambertus Donders, 's-Hertogenbosch (NL)

(73) Assignee: ASML Netherlands B.V., Veldhoven (NL)

(*) Notice: Subject to any disclaimer, the term of this patent is extended or adjusted under 35 U.S.C. 154(b) by 66 days.

(21) Appl. No.: 10/980,833

(22) Filed: Nov. 4, 2004

(65) Prior Publication Data

US 2005/0122503 A1 Jun. 9, 2005

(30) Foreign Application Priority Data

Nov. 5, 2003 (EP) .................................. 03078504

(51) Int. Cl.
*G03B 27/58* (2006.01)
*G03B 27/62* (2006.01)
(52) U.S. Cl. ......................................... 355/72; 355/75
(58) Field of Classification Search .................. 35/72, 35/53, 30; 355/53, 30, 72, 75; 361/234
See application file for complete search history.

(56) References Cited

U.S. PATENT DOCUMENTS

| | | | | |
|---|---|---|---|---|
| 5,777,838 A | * | 7/1998 | Tamagawa et al. | 361/234 |
| 5,997,963 A | * | 12/1999 | Davison et al. | 427/582 |
| 6,033,478 A | * | 3/2000 | Kholodenko | 118/500 |
| 6,664,549 B2 | * | 12/2003 | Kobayashi et al. | 250/440.11 |
| 6,905,984 B2 | * | 6/2005 | Kellerman et al. | 438/597 |
| 2001/0005595 A1 | * | 6/2001 | Morita et al. | 438/22 |
| 2002/0008864 A1 | * | 1/2002 | Kondo | 355/72 |
| 2002/0101956 A1 | | 8/2002 | Hara et al. | |
| 2002/0159217 A1 | | 10/2002 | Tsuruta et al. | |
| 2003/0127605 A1 | | 7/2003 | KONDO | 250/492.2 |

FOREIGN PATENT DOCUMENTS

| | | |
|---|---|---|
| EP | 0 985 976 A2 | 3/2000 |
| EP | 0 993 024 A2 | 4/2000 |
| EP | 1 119 040 A2 | 7/2001 |
| EP | 0 993 024 A3 | 7/2002 |
| EP | 1 241 706 A2 | 9/2002 |
| EP | 1 241 706 A3 | 2/2004 |
| WO | WO 98/14999 | 4/1998 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes an illumination system for conditioning a beam of radiation, and an article support for supporting a substantially flat article to be placed in a beam path of the beam of radiation. The article support includes a plurality of supporting protrusions that define a support zone for providing a substantially flat plane of support. The apparatus also includes a backfill gas feed for providing an improved thermal conduction between the article and the article support. The backfill gas feed includes a backfill gas discharge zone for feeding backfill gas to a backside of the article when supported by the article support. The backfill gas discharge zone substantially encloses the support zone.

17 Claims, 7 Drawing Sheets

LITHOGRAPHIC APPARATUS AND DEVICE MANUFACTURING METHOD

CROSS-REFERENCE TO RELATED APPLICATIONS

This application claims the benefit of priority from European Patent Application No. 3078504.2, filed Nov. 5, 2003, the entire content of which is incorporated herein by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction), while synchronously scanning the substrate parallel or anti-parallel to this direction.

In the conventional lithographic projection apparatus, during photolithographic processes, an article, such as a wafer or reticle is clamped on an article support by a clamping force, that may range from vacuum pressure forces, electrostatic forces, intermolecular binding forces or just gravity force. The article support defines a plane, in the form of a plurality of protrusions defining an even flat surface on which the wafer or reticle is held. Tiny variations in the height of these protrusions may be detrimental to image resolution, because a small deflection of the article from an ideal plane orientation may result in rotation of the wafer and a resulting overlay error due to this rotation. In addition, such height variations of the article support may result in a height variation of the article that is supported thereby. During the lithographic process, such height variations may affect image resolution due to a limited focal distance of the projection system. Therefore, it is desirable to have an ideal flat article support.

European patent application EP0947884 describes a lithographic apparatus that has a substrate holder in which protrusions are arranged to improve the flatness of the substrate. These protrusions have a general diameter of 0.5 mm and are located generally at a distance of 3 mm away from each other, and thereby form a bed of supporting members that support the substrate. The height of the protrusions lies in the range 1 mu m-15 mu m. Due to the relative large spaces in between the protrusions, contaminations that may be present generally do not form an obstruction for the flatness of the substrate, because these tend to lie in between the protrusions and should not lift the substrate locally.

In the context of this application, the "article" may be any of the above mentioned terms of wafer, reticle, mask, or substrate, or more specifically, may be a substrate to be processed in manufacturing devices employing lithographic projection techniques, or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

In lithographic processing, passing of the projection beam through gas compositions present between the illumination system and the articles to be illuminated, in particular non-homogenous gas compositions, may cause undesired effects such as diffraction, refraction and absorption. These effects may have an adverse effect on illumination quality, in particular, on a required resolution to be reached for the ever increasing demand in imaging performance. A new generation of lithography, the EUV-lithography, which uses a projection beam in the Extreme UltraViolet area, therefore operates in (near) vacuum conditions in order to allow the projection beam of radiation to pass substantially unhindered to the article to be placed in the beam. In this context, the term vacuum pressure is relative to particular gasses that are present in the environment. For example, for carbonhydrogens and water, the allowable background pressure is typically very low, in the order of 1e-9-1e-12 millibar. For inert gasses, the requirements may be less strict, for example, for Ar, an allowable background pressure ranges from 1e-4 mbar-1e-2 mbar, in particular, a pressure of 1e-3 mbar. Also, the relative background pressure may vary in terms of the environment of the apparatus. For example, where the article support functions in the environment of a wafer support, the vacuum requirements for certain components may be less strict than in an environment where the article support functions as a reticle support. That is, the partial pressures for contaminants (such as CxHy and H2O) may differ by a factor of 100 between the optics compartment (including reticle support) and the wafer compartment, and may be much lower than the total pressure (typical numbers are 1e-9 to 1e-12 mbar).

This vacuum technology offers challenges in terms of temperature control. For example, in some cases, the article support may have only a very small part (ranging from 0.1 to 3% of a total area) of the bottom side of the article that actually makes physical contact with the article support when being supported thereby, because the protrusions are shaped to provide only a very small contact area, and the protrusions are furthermore spaced relatively wide apart. In the vacuum pressure ranges that are used, thermal conductivity is substantially proportional to the pressure, which means that the thermal energy absorbed by the article when placed in the projection beam may no longer be adequately diverted, so that unwanted thermal heating of the article support may lead to thermal expansion, and may also lead to projection inaccuracies or potentially to even the loss of the article. To overcome this problem, in some instances, use is made of a so-called back-fill gas, which offers a thermal conduction from the article to the article support to divert the thermal energy absorbed by the article. The article support may be further provided with a cooler such as cooling ducts having cooling media etc. However, to confine the back-fill gas to the bottom side of the article, the conventional approach typically provides a so-called "hard rim", which is a boundary wall that substantially seals off the backfill gas from the vacuum by forming a gas seal between the bottom side of the article and the upper side of the article support.

It has been found, however, that, in terms of illumination performance, such a hard rim may cause problems. The presence of a sealing rim provides additional support to carry the article. Such additional support may disturb the pressure load of the article, which may cause local bending of the article. Such bending introduces rotation of the article surface, which may cause overlay effects that are undesired. Furthermore, a sealing rim provides almost a doubling of the contact area between the article and article support. This may be undesirable because it is an aim to minimize such contact area in order to prevent contamination particles to come in between the contact zones, which may create unevenness of the support and any corresponding bending problems of the article.

Furthermore, the presence of such a hard rim defines a definite outer area of the article where no backfill gas is present to provide thermal conductivity. This may cause local overheating or undesired temperature gradients in the article.

SUMMARY

The invention has as an aspect to provide a lithographic apparatus in which the above mentioned problems are overcome, and in which a backfill gas supply is provided that does not suffer from the above-mentioned drawbacks.

In an embodiment, a lithographic apparatus is provided. The apparatus includes an illumination system for providing a projection beam of radiation; an article support for supporting a flat article to be placed in a beam path of the projection beam of radiation on the article support, including a plurality of supporting protrusions, the plurality of protrusions defining a support zone for providing a flat plane of support; and a backfill gas feed including a backfill gas discharge zone arranged in the support zone for feeding backfill gas to a backside of the article when supported by the article support, for providing an improved thermal conduction between the article and the article support.

More specifically, in a photolithographic article that includes an article support, the backfill gas discharge zone substantially encloses the support zone, and a backfill gas discharge is provided in which selected positions, preferably along all positions along a perimeter of the support area, are put on a predetermined backfill gas pressure. The resultant backfill gas flow will in steady state have filled the enclosed area, thus providing a substantially constant backfill gas pressure in the area, resulting in uniform thermal conductivity properties in the area. In a preferred embodiment, the discharge zone has a reduced gas flow resistance relative to a gas flow resistance between the article and the article support. For example, not only a gas feed channel towards the discharge zone but also the gas feed areas surrounding the discharge opening of the gas feed channels, forming a gas discharge zone, may be designed to have a reduced flow impedance, resulting in a short waiting time where the backfill gas fills the backside of the article. Further, preferably, the discharge zone may be formed by a concentric gas feed trough. In particular, for a circular support area, the discharge zone may be formed by a annular recess close to the perimeter of the support area. The annular recess forms a trough, which is bounded by the article when supported by the article support.

In an embodiment, a lithographic apparatus is provided. The apparatus includes an illumination system for conditioning a beam of radiation, and an article support for supporting a substantially flat article to be placed in a beam path of the beam of radiation. The article support includes a plurality of supporting protrusions that define a support zone for providing a substantially flat plane of support. The apparatus also includes a backfill gas feed for providing an improved thermal conduction between the article and the article support. The backfill gas feed includes a backfill gas discharge zone for feeding backfill gas to a backside of the article when supported by the article support. The backfill gas discharge zone substantially encloses the support zone.

In an alternative embodiment or in combination therewith, the discharge zone may includes a plurality of spaced apart gas feeds. Specifically, the spaced apart gas feeds may be formed by gas channel openings that form a regular concentric pattern of arranged close to the boundary of the support area.

In order to decrease the filling time, a further backfill gas discharge zone may be provided central to the support zone. The backfill gas discharge zone enclosing the support zone and the further backfill gas discharge zone central to the support zone may be connected through gas flow channels or troughs.

In hard rim configurations, the article typically extends beyond the hard rim. Hence, in such configurations, in a boundary zone of the article, no thermal conductivity is provided due to the absence of backfill gas. In the configuration according to the invention, even in the reduced backfill gas pressure zone, outside the enclosed area, thermal conductivity is provided which provides improved thermal conductivity in the boundary zone of the article.

According to the invention, the support zone may not be bounded by a hard-rim seal, or may not be bounded by a boundary wall at all. Because the discharge zone substantially encloses the support zone, in only a small fraction of the support zone, the backfill gas pressure drops, eventually to the (vacuum) pressure conditions that are present in the lithographic apparatus. Hence, it follows that the seal configuration may be dispensed with, thereby resulting in better leveling properties of the article support. In some designs, it may be beneficial to have some sort of seal, in particular a "non-contact" seal, or "leaking" seal, that forms an increased flow resistance to limit the gas flow and increase the gas pressure near the boundary of the article. Therefore, the support zone may be bounded by a boundary wall that defines a boundary wall height that lies below the plane of support. This embodiment may work particularly well where the backfill gas is an inert gas, such as Argon. For these kind of gasses, the allowable background pressure of the vacuum surrounding is relative high, and a leaking rate of less than 1 mbar*l/s, in particular 0.15 mbar*l/s, is acceptable for Argon as a backfill gas, depending on the relative position of the article support. In the absence of a sealing boundary, the leaking rate was calculated to be 0.12 mbar*l/s, which was found to be within the above indicated upper limit. In a preferred embodiment, the calculated leak rate was 3e-3 mbar*l/s, which is far within above maximum specification. These values are for an applied background pressure of 1e-3 mbar. When the background pressure of the vacuum environment is lower, the leaking rate may be lowered correspondingly. A trough may be present immediately adjacent to the boundary wall. Such an increased volume for the backfill gas near the sealing boundary may form an increased flow resistance in the molecular flow regime.

Although the backfill gas configuration of the invention may be operated in other pressure environments, preferably, the invention is used in a lithographic apparatus including a vacuum pump system for providing a vacuum pressure for operating the lithographic apparatus in vacuum pressure conditions, the vacuum pump operating to eliminate backfill gas flowing from the backside of the article.

In such configuration, the vacuum pump, in particular, a vacuum turbo pump, is simply operated to remove the leaking backfill gas. Such removal is practiced efficiently if the vacuum pump system includes a suction zone enclosing the support zone. In such a case, escaping back fill gas particles may be captured directly before possibly adversely affecting the illumination process.

In an embodiment, an article support for a lithographic apparatus is provided. The article support includes a plurality of supporting protrusions that define a support zone for providing a substantially flat plane of support for an article, and a backfill gas feed for providing an improved thermal conduction between the article and the article support. The backfill gas feed includes a backfill gas discharge zone for feeding backfill gas to a backside of the article when supported by the article support. The backfill gas discharge zone substantially encloses the support zone.

In an embodiment, a device manufacturing method is provided. The method includes patterning a beam of radiation with a patterning device. The patterning device is supported by an article support. The article support includes a plurality of supporting protrusions that define a support zone for providing a substantially flat plane of support for the patterning device. The method also includes projecting the patterned beam of radiation onto a target portion of a substrate, and feeding backfill gas with a backfill gas feed to a backside of the patterning device when the patterning device is being supported by the article support. The backfill gas feed includes a backfill gas discharge zone that substantially encloses the support zone.

In an embodiment, a device manufacturing method is provided. The method includes patterning a beam of radiation with a patterning device, and projecting the patterned beam of radiation onto a target portion of a substrate. The substrate is supported by an article support. The article support includes a plurality of supporting protrusions that define a support zone for providing a substantially flat plane of support for the substrate. The method also includes feeding backfill gas with a backfill gas feed to a backside of the substrate when the substrate is being supported by the article support. The backfill gas feed includes a backfill gas discharge zone that substantially encloses the support zone.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
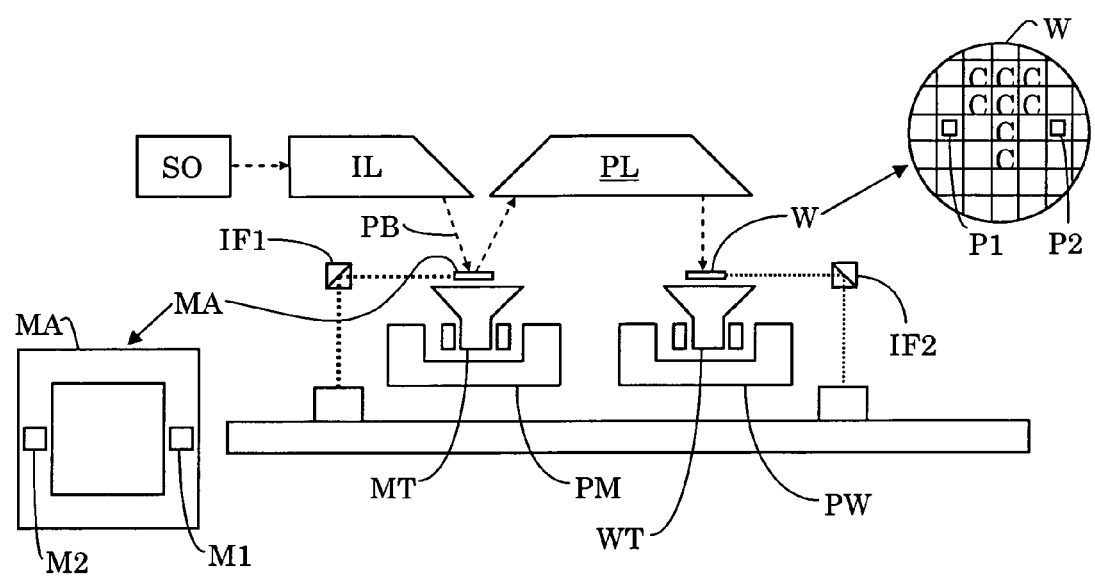
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV or EUV radiation), a first support structure (e.g. a mask table) MT for supporting a patterning device (e.g. a mask) MA and connected to a first positioner PM for accurately positioning the patterning device with respect to item PL, a substrate table (e.g. a wafer table) WT for holding a substrate (e.g. a resist-coated wafer) W and connected to a second positioner PW for accurately positioning the substrate with respect to item PL, and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjuster for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, e.g. so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
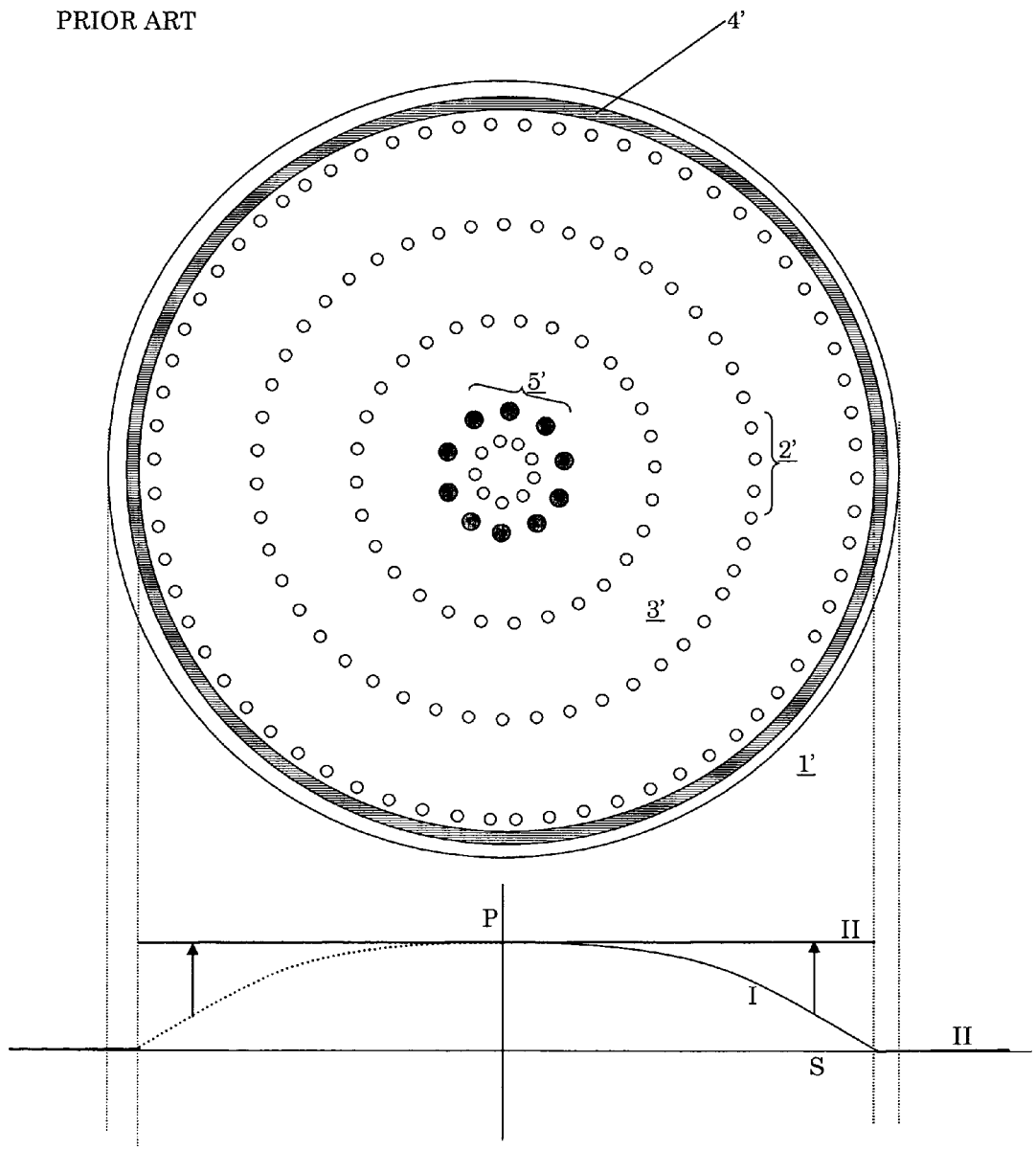
FIG. 2 depicts a conventional electrostatic article support.

FIG. 2 depicts a prior-art embodiment of an article support 1'. In this embodiment, the article support 1' is for supporting a wafer, shortly to be called wafer support table, and generally circular in form, which is common for wafer support tables. However, the article support may also be of another shape, in particular, a square shape. The wafer support table 1' includes a plurality of protrusions 2' that are dimensioned to provide a flat support for supporting a wafer (not shown). For clarity's sake, only a few protrusions 2' are referenced; generally, in the drawings they are indicated by open circles. The protrusions 2' thereby define a support zone 3'. The boundary of the support zone 3' is formed by a surrounding wall 4', which forms a seal for confining backfill gas (not shown). The surrounding wall 4' is of the same height as the supporting protrusions 2' and thereby forms a supporting element for also supporting the wafer. This type of support is indicated as a "hard-rim" seal since the boundary wall 4' physically contacts the wafer during sealing and presses the bottom side thereof. This causes the wafer to deform and unevenness is introduced in the support of the wafer, so that the wafer surface to be irradiated is not perfectly flat.

In the wafer support table 1' of FIG. 2, backfill gas is introduced via gas feeds 5', which are located at selected positions, usually nearby the center of the wafer support table 1', or somewhere slightly off center, as depicted in FIG. 2. For clarity's sake, only a few of the feeds 5' are referenced, generally, in the drawings, the feeds are indicated by closed circles or thick lines. During filling, the backfill-gas pressure expands from the positions of the feeds 5', which is schematically indicated in the associated corresponding pressure diagram schematically depicting a backfill gas pressure P as a relation of radial position S from the center of the wafer support table (arbitrary units). It can be seen that a bell-shaped pressure curve I expands to a fully expanded, substantially even gas pressure II in the support zone 3', confined by the sealing rim 4'. Outside sealing rim 4' there is no backfill gas and consequently no backfill gas pressure; consequentially there is no thermal conduction in the outer zone of the wafer support table 1', which may lead to adverse effects, such as local thermal expansion, which may be detrimental to image resolution and even contribute to degrading of the wafer and/or wafer support table 1'.

Figure 3:
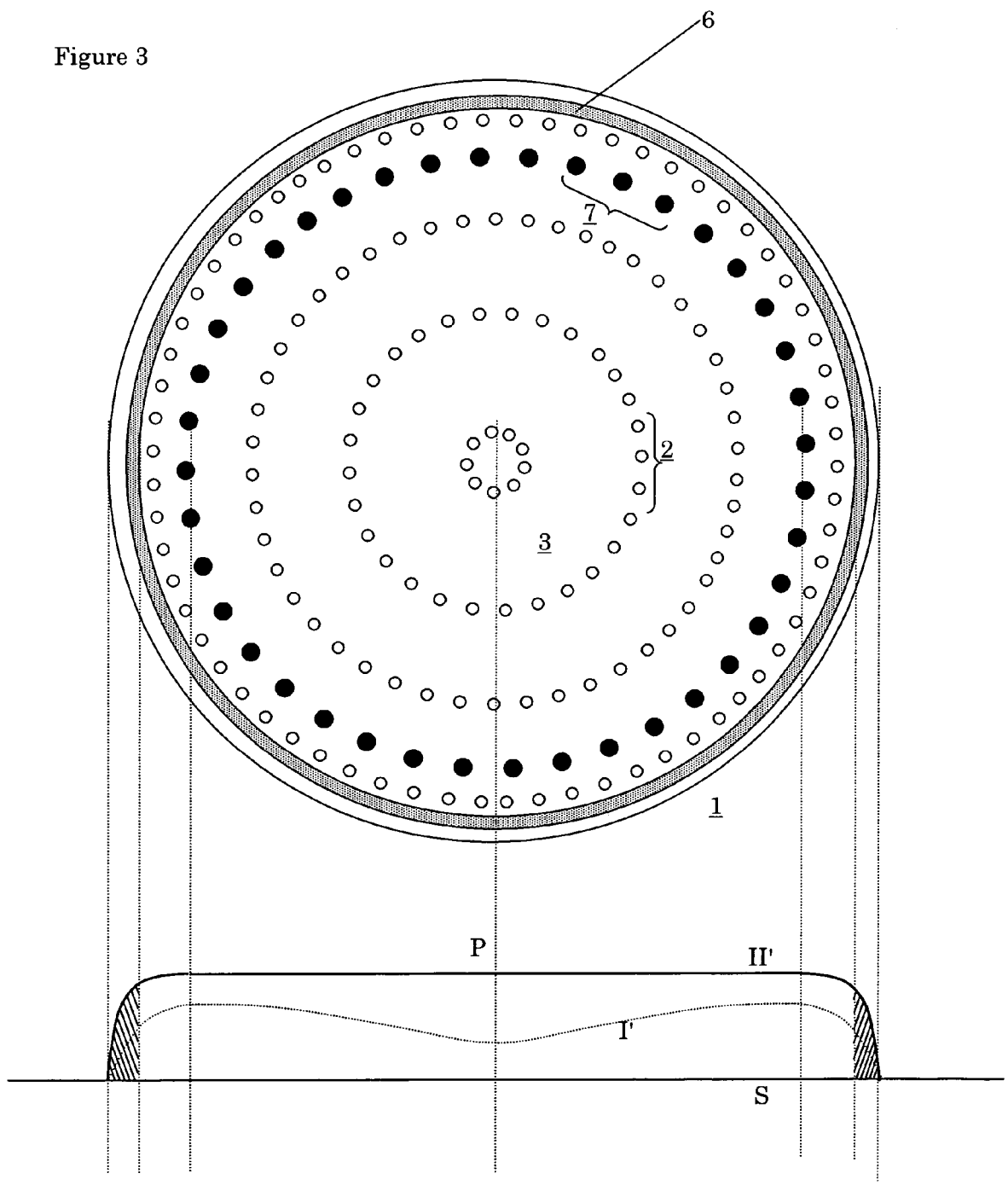
FIG. 3 depicts an article support according to the invention.

FIG. 3 shows a first embodiment of the article support 1 according to the invention. Again, the shown embodiment is in the form of a wafer support table 1, of a substantially circular form. Here, the supporting zone 3 is not bounded by a hard-rim seal but by a leaking seal 6. For the purpose of the invention, this leaking seal 6 may even be absent, provided that the flow characteristics of the backfill gas pressure, in relation to the feed positions is such that a sufficient pressure may be built up in the presence of the ambient pressure, which is often a vacuum pressure. According to the invention, boundary gas feeds 7 form a gas discharge zone that substantially enclose the support zone 3 since they are positioned near the border thereof. As a practical value, for example, to substantially enclose the support zone 3 the gas feeds 5 are positioned near the boundary distanced from 1-40%, preferably from 1-15%, even more preferably, 1-5% away from the boundary 6 relative to a radial distance of the wafer support table 1. The positions of the gas feeds 7 should be as far to the boundary 6 as possible, without compromising the gas inflow to the center of the wafer support table 1 too much or the gas outflow from under the wafer too much. During filling, the backfill-gas pressure expands from the feeds 7, which is schematically indicated in the associated corresponding pressure diagram schematically depicting a backfill gas pressure P as a relation of radial position S from the center of the wafer support table (arbitrary units). Because the pressure near the gas feeds 7 is controlled to a predetermined level, in the steady state, the backfill gas pressure in the support zone 3 is maintained on the same predetermined level II' as well. In this embodiment, the pressure curve expands from the boundaries of the supporting zone to a full spread over the whole supporting zone 3, as indicated by pressure level I'. Due to gas outflow through the leaking seal zone 6, the pressure drops to a zero level substantially further away from the center as in the hard-seal configuration depicted in FIG. 1, thereby providing better thermal conduction in the boundary zone of the wafer. Hence, the adverse effects as discussed with reference to FIG. 1 may be overcome, and a better image resolution may be provided near the boundaries of the wafer.

Figure 4:
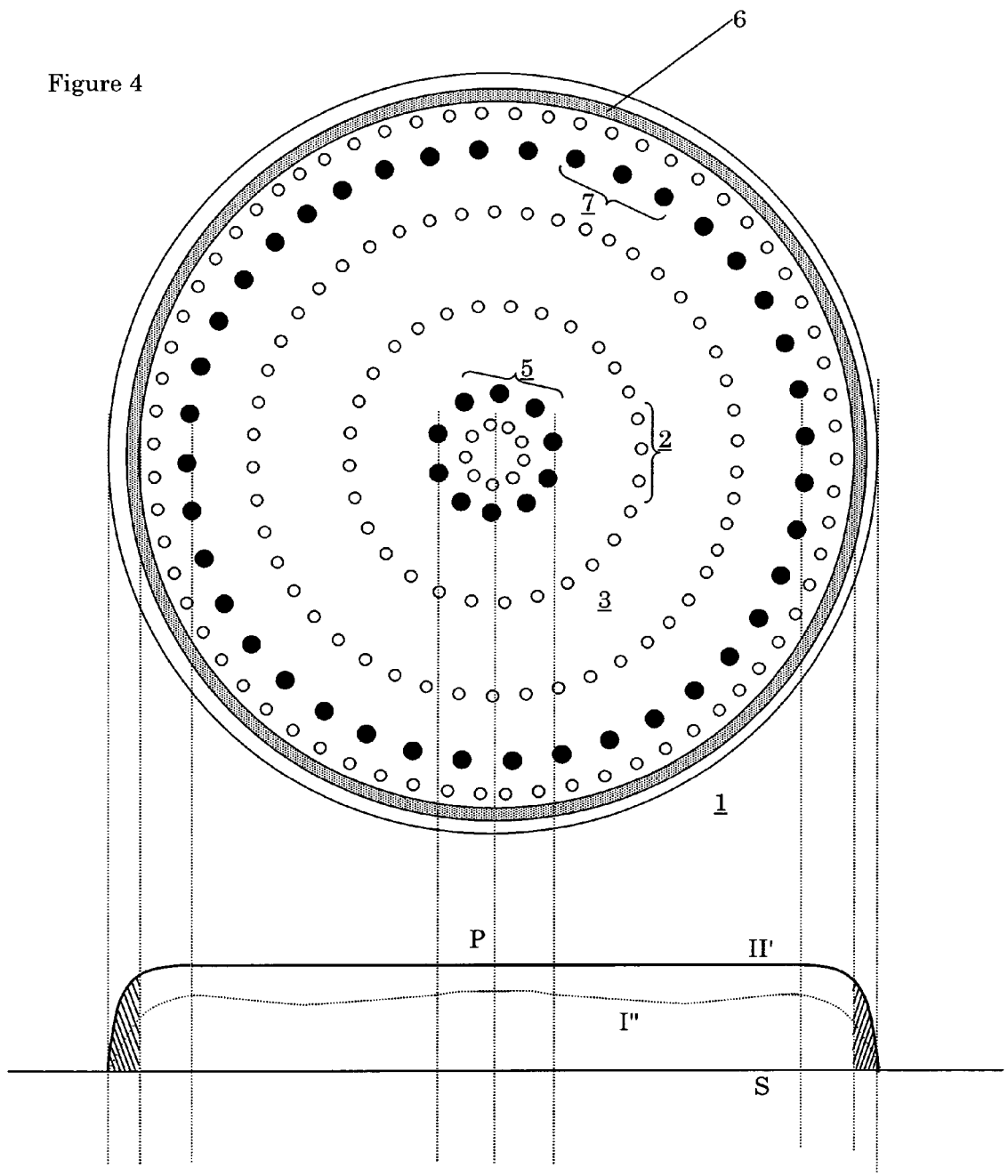
FIG. 4 depicts an alternative embodiment of the article support according to the invention.

FIG. 4 shows an alternative embodiment, in which central feeds 5 are added in addition to the boundary feeds 7. The presence of such central feeds 5 may be beneficial in that the steady state configuration with reference to FIG. 3 is reached faster. Once reached, the gas outflow in the central feeds 5 may be shut off.

Figure 5:
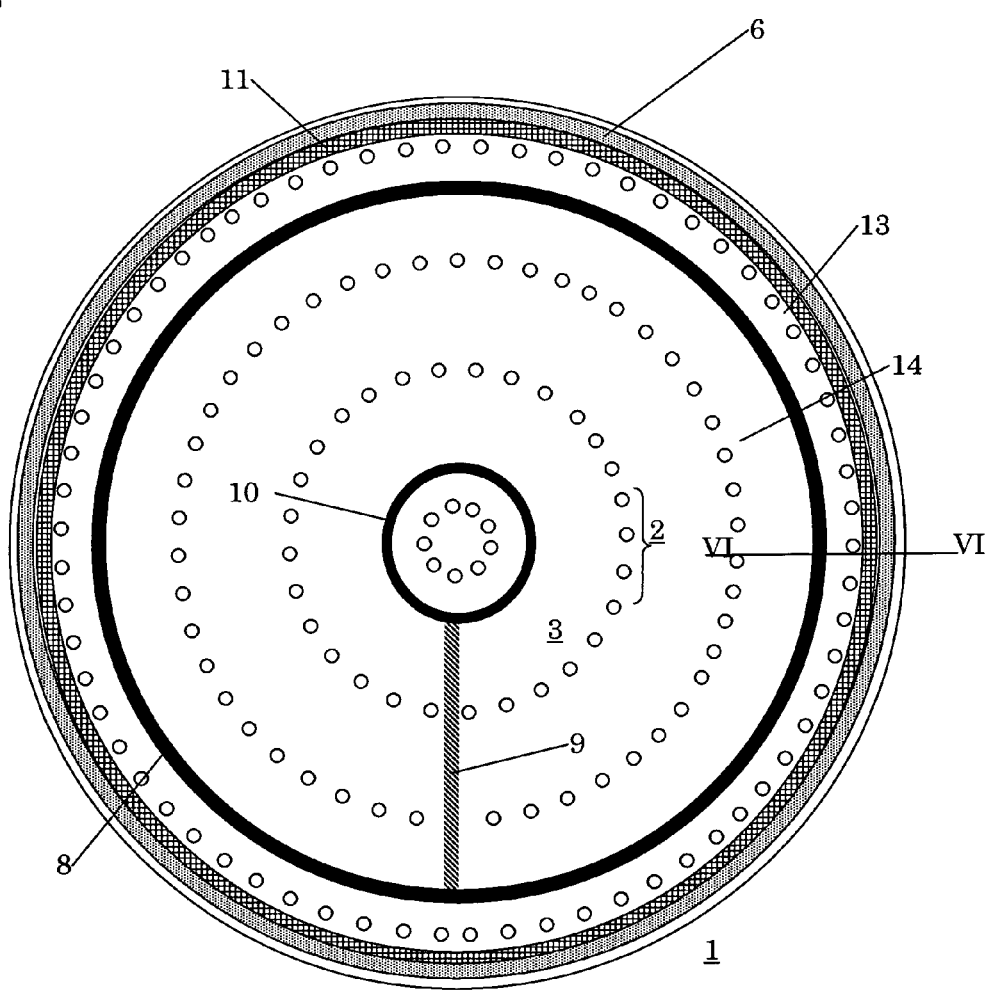
FIG. 5 depicts yet another embodiment of the article support according to the invention.

FIG. 5 shows a further alternative embodiment of the article support 1, in which the gas feeds are formed by troughs 8, 10, that are positioned at predetermined positions in the supporting zone 3. At least one of the troughs substantially encloses the supporting zone 3, as indicated by the outer trough 8. The troughs 8, 10 may be in gas feeding connection with each other, as indicated by a linking channel 9. Such channels may open, forming a linking trough 9. Such channels 9 may also be buried in the article support and only at the ends thereof forming open connections to the backfill gas feeding zone 8 and other, more interior zone(s) 10. A further trough 11 may be present adjacent to the leaking boundary seal 6. Such a trough 11 may form an improved blockade for the outflow of gas through the boundary seal 6 in the molecular flow regime.

Figure 6:
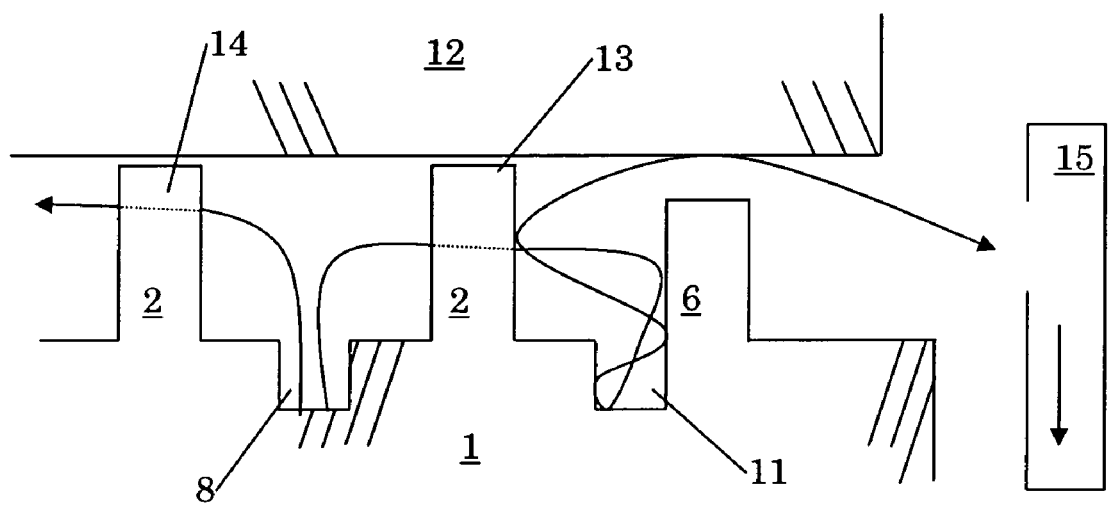
FIG. 6 depicts a side view of the article support according to FIG. 5 taken along the line VI-VI.

FIG. 6 shows a schematic height map of the article support 1 along the lines VI-VI depicted in FIG. 5. A wafer 12 is positioned on top of the protrusions 2 (for clarity's sake depicted with a slight gap therebetween). The height of the protrusions 2 is a conventional height of approximately 5 mu m, whereas the leaking seal 6 is lowered to that height by an amount of 0.1-5 mu m. It is noted that in an optimized configuration, the leaking seal 6 may be altogether absent.

Between the last row 13 and second last row 14 of protrusions 2, a gas feed trough 8 is present. Between the leaking seal and the outer row 13, a further trough 11 is present. Directly outside of the wafer support, a suction pump 15 may be present to trap outflowing gas. Schematically indicated is the flow path of a gas particle in the molecular flow regime. Due to the presence of the trough 11, an increased impedance to gas outflow may be formed.

Figure 7:
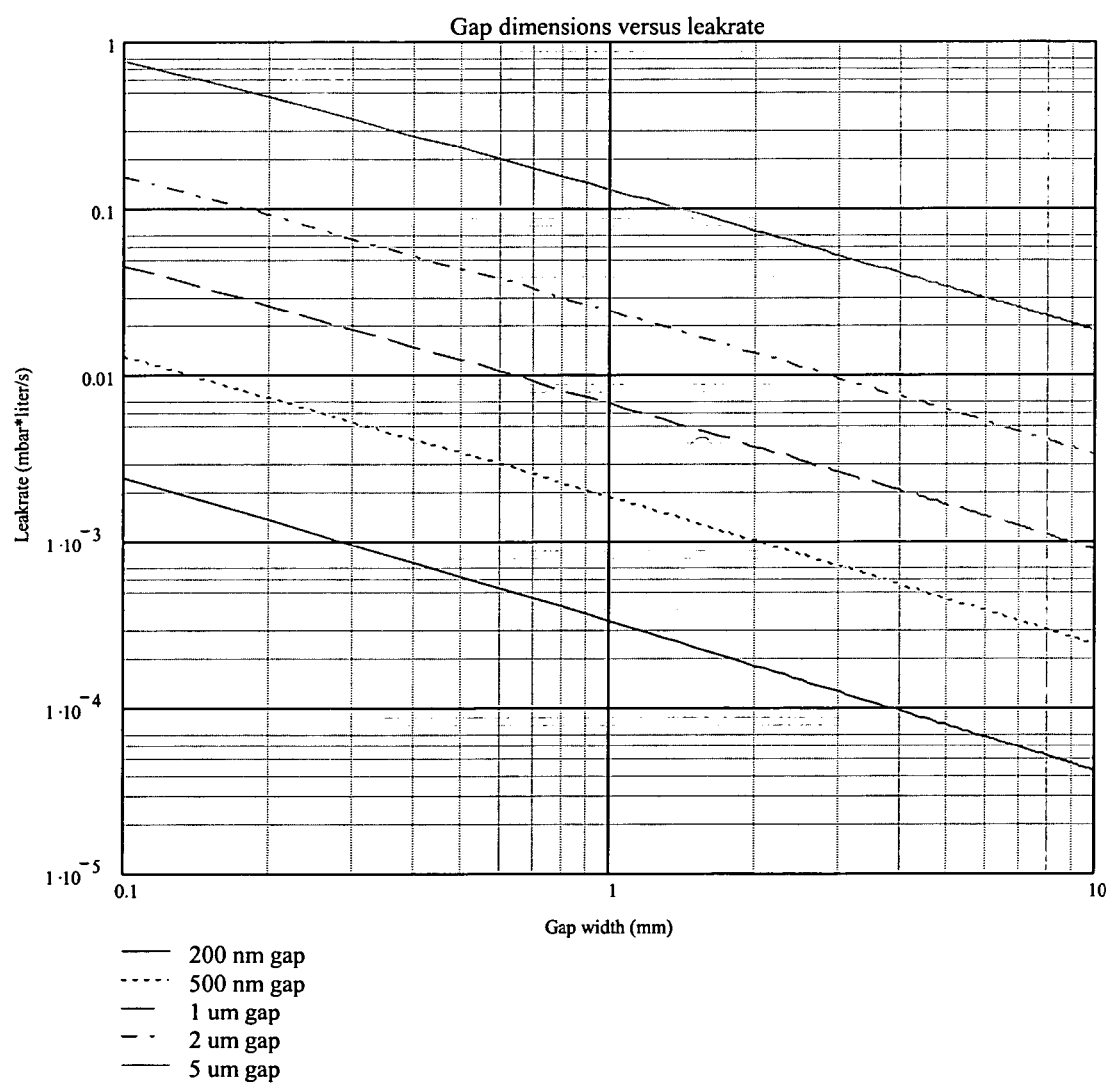
FIG. 7 illustrates a calculated leaking rate depending on the geometry of the boundary wall.

FIG. 7 illustrates the leak rates that are calculated depending on a particular geometry of the boundary wall for a standard wafer having a circumference of 942 mm. This geometry includes a boundary wall that has a lowered seal (indicated as "gap") of 200; 500; 1000; 2000 and 5000 nm. As expected, the leak rate increases with the gap width, so that the lower line in the chart corresponds to the lowest value and the upper line in the chart corresponds to the highest value of the gap. Furthermore, the gap width, corresponding to the distance of the boundary wall 6 to the gas supply feed 7, ranges from 0.1 mm to 10 mm. It is shown that in the indicated ranges, the leaking rate, expressed in mbar*liters/second varies from 0.5 e-4 to close to 1. For realistic embodiments, the leak rate of the backfill gas into the stage compartment should be less than 1 mbar*liter/s, more preferably less than 0.1 mbar*liter/s, most preferably less than 1e-5 mbar*liter/s. For a gap of 5 um and width of 1 mm, the leaking rate is about 0.12 mbar*l/s, well within the specified maximum leak rate. These values are for an applied (total) background pressure of about 1 e-3 mbar. When the background pressure of the vacuum environment is lower, the leaking rate will be lowered correspondingly. Furthermore, the leakrate of the backfill gas into the stage compartment should be less than 0.01 mbar*liter/s, more preferably less than 1e-3 mbar*liter/s, most preferably less than 1e-7 mbar*liter/s.

Hence, when the outer gas supply 7 is more than one mm outside the edge, the gap may be as much as 5 um. A preferred embodiment for a wafer includes a gap of 500 nm and 0.5 mm width, which give rise to a leakrate of 3e-3 mbar*l/s. For a reticle stage, such an embodiment includes a gap width of 2 mm and a gap of 200 nm, for a total circumference of 1136 mm.

The invention has been illustrated with reference to an article support that is substantially circular and that is used for supporting a wafer to be illuminated by the projection beam. However, to the skilled person it will be clear that the invention may as well be applied to any other article, in particular, to an article in the form of a reticle.

While specific embodiments of the invention have been described above, it will be appreciated that the invention may be practiced otherwise than as described. The description is not intended to limit the invention.

What is claimed is:

1. A lithographic apparatus comprising:
   an illumination system for conditioning a beam of radiation;
   an article support for supporting a substantially flat article to be placed in a beam path of said beam of radiation, said article support comprising a plurality of supporting protrusions that define a support zone, the protrusions providing article support portions lying in a plane; and
   a backfill gas feed for providing an improved thermal conduction between said article and said article support, said backfill gas feed comprising a first backfill gas discharge zone substantially enclosing said support zone and a second backfill gas discharge zone provided in a region near the center of said support zone, said first and second backfill gas discharge zones being constructed and arranged to feed backfill gas to a backside of said article when supported by said article support,
   wherein said first backfill gas discharge zone and said second backfill gas discharge zone are connected through at least one elongated gas flow channel, the gas flow channel communicating at one end with the first backfill gas discharge zone and at an opposite end with the second backfill gas discharge zone so as to provide a gas feeding communication between the first backfill gas discharge zone and the second backfill gas discharge zone, and
   wherein said gas flow channel is buried in the support or is an open trough in a surface of the support.

2. A lithographic apparatus according to claim 1, wherein said first discharge zone has a reduced gas flow resistance relative to a gas flow resistance between said article and said article support.

3. A lithographic apparatus according to claim 1, wherein said first discharge zone is formed by a concentric gas feed trough.

4. A lithographic apparatus according to claim 1, wherein said first discharge zone comprises a plurality of spaced apart gas feeds.

5. A lithographic apparatus according to claim 1, wherein said support zone is not bounded by a hard-rim seal.

6. A lithographic apparatus according to claim 5, wherein said support zone is not bounded by a boundary wall.

7. A lithographic apparatus according to claim 1, wherein said support zone is bounded by a boundary wall defining a boundary wall height that lies below said plane of support.

8. A lithographic apparatus according to claim 7, wherein a trough is present immediately adjacent to said boundary wall.

9. A lithographic apparatus according to claim 1, further comprising a vacuum pump system for providing a vacuum pressure for operating said lithographic apparatus in vacuum pressure conditions, said vacuum pump operating to eliminate backfill gas flowing from the backside of said article.

10. A lithographic apparatus according to claim 9, wherein said vacuum pump system comprises a suction zone enclosing said support zone.

11. A lithographic apparatus according to claim 1, wherein said article support is a support for supporting a patterning device, the patterning device serving to impart the beam of radiation with a pattern in its cross-section.

12. A lithographic apparatus according to claim 1, wherein said article support is a substrate table for holding a substrate to be patterned by a patterned beam onto a target portion of the substrate.

13. An article support for a lithographic apparatus, the article support comprising:
    a plurality of supporting protrusions that define a support zone, the protrusions providing article support portions lying in a plane; and
    a backfill gas feed for providing an improved thermal conduction between said article and said article support, said backfill gas feed comprising a first backfill gas discharge zone substantially enclosing said support zone and a second backfill gas discharge zone provided in a region near the center of said support zone, said first and second backfill gas discharge zones being constructed and arranged to feed backfill gas to a backside of said article when supported by said article support,
    wherein said first backfill gas discharge zone and said second backfill gas discharge zone are connected through at least one elongated gas flow channel, the gas flow channel communicating at one end with the first backfill gas discharge zone and at an opposite end with the second backfill gas discharge zone so as to provide a gas feeding communication between the first backfill gas discharge zone and the second backfill gas discharge zone, and
    wherein said gas flow channel is buried in the support or is an open trough in a surface of the support.

14. A device manufacturing method comprising:
    patterning a beam of radiation with a patterning device, the patterning device being supported by an article support, said article support comprising a plurality of supporting protrusions that define a support zone, the protrusions providing patterning device support portions lying in a plane;
    projecting the patterned beam of radiation onto a target portion of a substrate; and
    feeding backfill gas with a backfill gas feed to a backside of said patterning device when said patterning device is being supported by said article support, said backfill gas feed comprising a first backfill gas discharge zone that substantially encloses said support zone and a second backfill gas discharge zone provided in a region near the center of said support zone, said first backfill gas discharge zone and said second backfill gas discharge zone being connected through at least one elongated channel, said channel communicating at one end with the first backfill gas discharge zone and at an opposite end with the second backfill gas discharge zone so as to provide a gas feeding communication between the first backfill gas discharge zone and the second backfill gas discharge zone, said channel being buried in the support or being an open trough in a surface of the support.

15. A device manufacturing method comprising:
    patterning a beam of radiation with a patterning device;

projecting the patterned beam of radiation onto a target portion of a substrate, the substrate being supported by an article support, said article support comprising a plurality of supporting protrusions that define a support zone, the protrusions providing substrate support portions lying in a plane; and feeding backfill gas with a backfill gas feed to a backside of said substrate when said substrate is being supported by said article support, said backfill gas feed comprising a first backfill gas discharge zone that substantially encloses said support zone and a second backfill gas discharge zone provided in a region near the center of said support zone, said first backfill gas discharge zone and said second backfill gas discharge zone being connected through at least one elongated channel, said channel communicating at one end with the first backfill gas discharge zone and at an opposite end with the second backfill gas discharge zone so as to provide a gas feeding communication between the first backfill gas discharge zone and the second backfill gas discharge zone, said channel being buried in the support or being an open trough in a surface of the support.

16. A lithographic apparatus according to claim 1, wherein said at least one channel is buried in said article support.

17. An article support according to claim 13, wherein said at least one channel is buried in the article support.

* * * * *